US008824974B2

(12) United States Patent
Nakajima et al.

(10) Patent No.: US 8,824,974 B2
(45) Date of Patent: Sep. 2, 2014

(54) SEMICONDUCTOR INTEGRATED CIRCUIT DEVICE AND RADIO FREQUENCY MODULE

(75) Inventors: Akishige Nakajima, Tokyo (JP); Yasushi Shigeno, Tokyo (JP); Takashi Ogawa, Tokyo (JP); Shinnichirou Takatani, Tokyo (JP); Shinya Osakabe, Tokyo (JP); Tomoyuki Ishikawa, Tokyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/910,071

(22) Filed: Oct. 22, 2010

(65) Prior Publication Data

US 2011/0034137 A1 Feb. 10, 2011

Related U.S. Application Data

(63) Continuation of application No. 11/765,236, filed on Jun. 19, 2007, now abandoned.

(30) Foreign Application Priority Data

Jun. 29, 2006 (JP) ................................ 2006-178928

(51) Int. Cl.
*H04B 1/44* (2006.01)

(52) U.S. Cl.
USPC ............. 455/78; 455/83; 455/127.1; 257/728

(58) Field of Classification Search
CPC ....................................................... H04B 1/006
USPC .......................................... 455/78, 83, 127.1
See application file for complete search history.

(56) References Cited

U.S. PATENT DOCUMENTS

| 4,689,620 | A | 8/1987 | Wondrak |
|---|---|---|---|
| 5,774,792 | A | 6/1998 | Tanaka et al. |
| 6,066,993 | A | 5/2000 | Yamamoto et al. |
| 6,987,414 | B2 | 1/2006 | Numata |
| 6,999,786 | B2 | 2/2006 | Iida |
| 7,106,121 | B2 | 9/2006 | Hidaka et al. |
| 7,269,392 | B2 | 9/2007 | Nakajima et al. |

(Continued)

FOREIGN PATENT DOCUMENTS

| CN | 1457558 A | 11/2003 |
|---|---|---|
| CN | 1606248 A | 4/2005 |

(Continued)

OTHER PUBLICATIONS

Korean Office Action dated Aug. 18, 2013 issued by the Korean IPG.

*Primary Examiner* — Hsin-Chun Liao
(74) *Attorney, Agent, or Firm* — Mattingly & Malur, PC

(57) ABSTRACT

The present invention provides a semiconductor integrated circuit device and a radio frequency module realizing reduction in high-order harmonic distortion or IMD. For example, a so-called antenna switch having a plurality of transistors between an antenna terminal and a plurality of signal terminals is provided with a voltage supply circuit. The voltage supply circuit is a circuit for supplying voltage from a voltage supply terminal to at least two signal terminals in the plurality of signal terminals via resistive elements. With the configuration, antenna voltage dropped due to a leakage or the like can be boosted and, for example, transistors in an off state can be set to a deep off state.

8 Claims, 7 Drawing Sheets

(56) References Cited

U.S. PATENT DOCUMENTS

| | | |
|---|---|---|
| 2003/0181167 A1* | 9/2003 | Iida .................................. 455/78 |
| 2005/0079829 A1* | 4/2005 | Ogawa et al. .................... 455/83 |
| 2005/0170789 A1 | 8/2005 | Consolazio |
| 2005/0245202 A1* | 11/2005 | Ranta et al. ...................... 455/78 |
| 2006/0118951 A1 | 6/2006 | Ogawa et al. |

FOREIGN PATENT DOCUMENTS

| | | |
|---|---|---|
| JP | 8-70245 | 3/1996 |
| JP | 11-205188 A | 7/1999 |
| JP | 2000-277703 A | 10/2000 |
| JP | 2002-232278 A | 8/2002 |
| JP | 2002-246942 A | 8/2002 |
| JP | 2004-320429 A | 11/2004 |
| JP | 2005-72671 A | 3/2005 |
| JP | 2005-323030 A | 11/2005 |
| JP | 2006-165224 | 6/2006 |
| JP | 2007-5970 | 1/2007 |
| JP | 2007-67720 | 3/2007 |
| JP | 2007-67762 | 3/2007 |
| KR | 10-0366681 B1 | 3/2003 |

* cited by examiner $Vant = Vdd - Rg\_Q1 \times Ileak - Vf$

SEMICONDUCTOR INTEGRATED CIRCUIT DEVICE AND RADIO FREQUENCY MODULE

CROSS-REFERENCE TO RELATED APPLICATIONS

This application is a continuation of U.S. patent application Ser. No. 11/765,236 filed Jun. 19, 2007, which claims priority to Japanese Patent Application No. 2006-178928 filed on Jun. 29, 2006, the disclosure of which, including the specification, drawings and abstract, is incorporated herein by reference in its entirety.

BACKGROUND OF THE INVENTION

The present invention relates to a semiconductor integrated circuit device and a radio frequency module and, more particularly, to a technique effectively applied to a semiconductor integrated circuit device and a radio frequency module including an antenna switch mounted on a mobile communication device or the like.

For example, Japanese Unexamined Patent Publication No. Hei 8 (1996)-70245 (patent document 1) discloses an SPDT (Single Pole Double Throw) switch formed by an FET. For example, a dual gate FET is used as the FET, a capacitive element is coupled between a first gate and the source, and a capacitive element is coupled between a second gate and the drain. With the configuration, a radio frequency switch (antenna switch) having a low distortion characteristic and capable of operating with low voltage can be realized.

SUMMARY OF THE INVENTION

Prior to the present invention, the inventors of the present invention have filed techniques related to an antenna switch under Japanese Unexamined Patent Publication No. 2006-165224 (hereinafter, called reference document 1), Japanese Unexamined Patent Publication No. 2007-005970 (hereinafter, called reference document 2), Japanese Unexamined Patent Publication No. 2007-067762 (hereinafter, called reference document 3), and Japanese Unexamined Patent Publication No. 2007-067720 (hereinafter, called reference document 4). The inventors herein have examined the techniques of an antenna switch and found out the following.

For example, a cellular phone system is developing for realizing higher functions such as voice communication and the wireless Internet with the advent of the second-generation cellular phone and, moreover, TV telephone and voice (sound) and video distribution by using wireless Internet with the advent of the third-generation cellular phone. To realize such various services, the variety of communication methods is also widened, and EDGE (Enhanced Data rate for GMS Evolution) achieved by improving the communication speed of GSM (Global System for Mobile Communications), and W-CDMA (Wideband Code Division Multiple Access) have been devised.

The frequency band is also widened as the number of subscribers increases and the variety of communication methods increases. In Europe, EGSM (Extended GSM) using the 900 MHz band and DCS (Digital Cellular System) using the 1.8 GHz band are employed. In U.S.A, PCS (Personal Communication Service) using the 1.9 GHz band and GSM using the 850 MHz band are employed. W-CDMA using the 2 GHz band is added, and the multi bands and multi modes are essential conditions of a cellular phone.

In a cellular phone set manufacturer, development resources are shifted to software development for services and the like, and multifunction and miniaturization is being increasingly accelerated in hardware such as parts. In particular, radio frequency modules such as a high frequency power amplifier (HPA) module are requested to have multi-bands and multi-modes and realize miniaturization. Accordingly, a high-performance switch device capable of switching a plurality of high frequency signals is demanded. For example, an antenna switch mounted on a radio frequency module is having higher functions such as SP4T and SP6T from SPDT so as to address such requirements for multi bands and multi modes. An antenna switch is requested to have high linearity due to introduction of GSM using phase modulation and, in addition, EDGE using phase modulation and amplitude modulation, and main technical tasks are miniaturization and a distortion reducing technique.

An example of circuit means realizing distortion reduction is FETs coupled in multiple stages (a multi-gate configuration is effective from the viewpoint of prevention of an insertion loss), as devices for coupling/decoupling between a receiver and an antenna like an FET 2 in FIG. 1 in the patent document 1. At the time of switching high power transmitted from a transmitter to an antenna side, an FET in the off state (the FET 2 in FIG. 1 in the patent document 1) is not turned on. Consequently, the power supplied from the transmitter is output to the antenna without being leaked to a reception system, so that a low-loss switch can be realized for the following reasons. By multi-stage coupling, an RF voltage applied to the FET is dispersed and the RF voltage per stage can be reduced. In addition, gate-source capacitance (Cgs), gate-drain capacitance (Cgd), and RF voltage applied to anon resistor as causes of harmonic distortion decrease. Therefore, the FET in the off state is not erroneously turned on by power input from the transmitter.

As a countermeasure against harmonic distortion in the trend of multi gates, as shown in the reference document 1, a technique of providing a potential supply line at an intermediate point of the gates of a dual gate FET can be mentioned. By the technique, intermediate potential is stabilized, so that harmonic distortion can be reduced. In the reference document 2, by changing a method of coupling the potential supply line in the reference document 1, amount of a potential drop caused by leak current is suppressed, and harmonic distortion is further reduced.

In a switch circuit of SP6T shown in FIG. 2 in the reference document 3, in addition to the techniques of the patent document 1 and the reference documents 1 and 2, a booster circuit is provided for the gate of an FET for further reducing distortion. The problem of a delay in rise which occurs due to introduction of a communication method using voice communication (GSM) called DTM (Dual Transfer Mode) and data communication (EDGE) necessary for new cellular phone service in the same communication unit (frame) can be solved by providing an antenna terminal with a resistor (27) for a leak path as shown in FIG. 2 of the reference document 3. In the reference document 4, by providing, in place of the resistor (27) for a leak path in the reference document 3, a backflow preventing circuit (for example, a diode) for a switch control terminal (the gate of an FET), the problem of a delay in rise is solved.

In such a manner, high-performance antenna switches of the SP6T scale of low distortion can be realized by the techniques of the patent document 1 and the reference documents 1 to 4. However, to comply with the W-CDMA system introduced for high function services, the antenna switch has to increase the circuit scale from conventional SP6T to SP7T. Since the W-CDMA system is a system adapted to high-speed data communication, it is requested to have high linearity (low distortion) in a band wider than the conventional one. One of the characteristics showing high linearity requested for the W-CDMA system is IMD (intermodulation distortion).

FIG. 5 is a simplified block diagram showing an example of the configuration of a W-CDMA unit. A transmission system (transmission terminal) Tx and a reception system (reception terminal) Rx for W-CDMA are coupled to an antenna switch circuit SW via a duplexer DUP. The problem in the configuration is that an out-of-band blocker signal (disturbing wave) entering from an antenna is mixed with a Tx signal having transmission frequency of Tx in the W-CDMA band due to nonlinearity of the antenna switch circuit SW, and a distortion signal is leaked to an Rx signal band. The leakage amount is called IMD and has to be reduced. A general requirement specification of IMD is an extremely small value as −90 dBm or less as compared with −40 dBm or less of high-order harmonic distortion (second-order: 2HD, and third-order: 3HD) as a distortion characteristic requested for the GSM and PCS bands.

The high-order harmonic distortion (HD) is caused mainly by a device in an off state (a device for coupling/decoupling between the antenna and the transmission system or the reception system). As the countermeasure against the high-order harmonic distortion, the techniques of the patent document 1 and the reference documents 1 to 4 can be used. The IMD occurrence mechanism is the same as that of high-order harmonic distortion. The major part of the distortion is distortion caused by nonlinear elements of an off-state device (mainly, nonlinearity of voltage dependence of gate-source capacitance and gate-drain capacitance).

However, as the circuit scale increases with the version update to SP7T, the number of off-state devices increases. Reduction in the high-order harmonic distortion (HD) can be realized by setting an off-state device to a deeper off state by boosting an antenna voltage Vant (>4.0V) by a booster circuit. However, since the transmission power is as small as 24 dBm (GSM band transmission power: 35 dBm) in the W-CDMA system, the booster circuit does not operate and it is feared that distortion caused by the booster circuit deteriorates the IMD characteristic. As a result, a problem occurs such that the distortion (IMD) characteristic deteriorates. The phenomenon that the antenna voltage Vant exerts large influence on distortion will be described with reference to a simplified switch circuit (SPDT) shown in FIGS. 6A, 6B, and 6C.

FIGS. 6A, 6B, and 6C show an example of a switch circuit examined as the ground of the present invention. FIG. 6A is a circuit diagram showing a configuration example of the switch circuit, FIG. 6B is an equivalent circuit diagram of on devices, and FIG. 6C is a diagram illustrating an operation example. The switch circuit shown in FIG. 6A has a transistor Q1 between an antenna terminal ANT and a signal terminal Tx1a, and a transistor Q2 between ANT and a signal terminal Tx2a. The transistor Q1 is turned on when a control voltage Vdd (approximately 3.0V) is applied to the gate, and the transistor Q2 is turned off when 0V is applied to the gate.

An equivalent circuit of Q1 in an on state can be expressed by a Schottky diode, an on resistor (Ron), and the like as shown in FIG. 6B. When Vdd is applied to the gate, the Schottky diode is forward-biased and becomes conductive, and voltage is applied to the antenna terminal ANT. When current leaked via the gate and source and the gate and drain of the transistor Q2 in the off state is Ileak, the forward voltage of the Schottky diode is Vf, and a resistive element coupled to the gate of Q1 is Rg_Q1, the relation between the antenna voltage Vant and Vdd is expressed as the following equation (1).

$$Vant = Vdd - Rg\_Q1 \times Ileak - Vf \qquad \text{Equation (1)}$$

General numerical values are: Vf is approximately 0.4V, Rg_Q1 is approximately 15 kΩ, and Ileak is approximately 10 µA. The gate-source voltage Vgs (gate-drain voltage Vgd) of the transistor Q2 in the off state is designed to become −Vant which is deeper than a pinch-off voltage Vth (approximately −1.0V). When power Pin (high frequency voltage Vin) is input from a signal terminal Tx1a, the high frequency voltage Vin is generated between the drain and source of the transistor Q2 in the off state. The relational expression of Vin and Vgs and Vgd of Q2 is shown below as Equation (2).

$$Vin = Vgs + Vgd \qquad \text{Equation (2)}$$

Since a transistor has a structure symmetrical with respect to a gate electrode, Vgs=Vgd, and Vgs=Vin/2. Therefore, as shown in FIG. 6C, a high frequency voltage having an amplitude Vin/2 using −Vant as a center is applied to Vgs of Q2. The voltage dependency of the gate-source capacitance Cgs of Q2 has nonlinearity shown in FIG. 6C. The distortion (1MD, 2HD, and 3HD) occurs due to the nonlinearity or a pseudo on state of Q2 caused when Vgs becomes close to Vth.

Methods of reducing distortion include (1) to decrease the high frequency voltage Vin/2 of Vgs, (2) to deepen −Vant so as to be apart from Vth, (3) to reduce the voltage dependency of Cgs, and (4) to make Vth shallow so as to be apart from −Vant. Among the methods, solving methods which can be realized with a circuit configuration are the methods (1) and (2). First, to decrease the amplitude Vin/2 of Vgs in the method (1), it is sufficient to construct the transistor Q2 in the off state by coupling single-gate transistors in multiple stages and distribute Vin. FIGS. 7A and 7B show an example of the configuration and operation as a modification of the switch circuit of FIG. 6. FIG. 7A is a circuit diagram, showing a configuration example, and FIG. 7B is a diagram illustrating an operation example of FIG. 7A.

A switch circuit shown in FIG. 7A has configuration obtained by replacing the transistor Q2 in FIG. 6A with, for example, single-gate transistors Q2_1, Q2_2, and Q2_3 coupled in three stages. Since Vin is unchanged, high frequency voltage applied to one stage of Q2_1 is ⅓. As shown in FIG. 7B, Vgs has ⅓ as large as that in the 1-stage configuration and has a small voltage amplitude, and the switch circuit can operation in a region where voltage nonlinearity of Cgs is low. Since Vgs can be separated from Vth, a deep off-state can be assured, and distortion can be reduced. The multi-stage coupling (or multi-gate configuration) has the relation of a tradeoff with an insertion loss in the on state. The inventors of the present invention have examined and found that a triple-gate two-stage configuration (equivalent to six stages of single gates) is optimum.

There is also the method (2) of increasing Vdd by deepening −Vant so as to be apart from Vth. However, in the system specifications, from the viewpoint of realizing low power consumption and the like, the operation guarantee at a control voltage of 3.0V is necessary. As described above, it is also difficult to deepen −Vant by the booster circuit. Further, when the circuit scale becomes larger with the version-up to SP7T, leak current increases, and it decreases the antenna voltage Vant (in a circuit configuration of SP6T, for example, Vant is approximately 2.3V). As shown in FIG. 7B, a voltage drop like −V'ant (in a circuit configuration of SP7T, for example, V'ant is approximately 1.9V) occurs, a region of high nonlinearity of Cgs and a pseudo on region are created, and distortion increases.

An object of the present invention is to provide a semiconductor integrated circuit device and a radio frequency module realizing reduced high-order harmonic distortion or IMD. The above and other objects and novel features of the present invention will become apparent from the description of the specification and the appended drawings.

Outline of representative ones of the inventions disclosed in the specification will be briefly described as follows.

A semiconductor integrated circuit device according to the present invention has a configuration that, in a antenna switch having an antenna node, a plurality of signal nodes, and a plurality of transistors coupled between the antenna node and the signal nodes, voltage is supplied from a voltage supply node to which bias voltage is applied to at least two signal nodes out of the signal nodes via resistive elements.

With such a configuration, the bias voltage can be supplied to the antenna node from the voltage supply node via the parallel coupling of the resistive elements and the transistors (the resistive elements between the sources and drains). A transistor in an off state enters a deeper off state without becoming a pseudo on state and operates in a region where nonlinearity of Cgs is low, so that high-order harmonic distortion or IMD can be reduced. The resistance value of the resistive element coupled to the voltage supply node can be set to be larger than that in the case of supplying the bias voltage directly to the antenna node via the resistive element, so that the influence on the high-order harmonic distortion or IMD caused by the resistive element itself can be reduced.

In the configuration as described above, to reduce the influence on the high-order harmonic distortion or IMD caused by the resistive element itself, it is desirable to select a signal node to/from which a signal of lower power and/or low frequency is input/output as the signal node to which the resistive element is coupled. For example, in the case where the plurality of signal nodes include a signal node for the W-CDMA method of a low frequency band, a signal node for a frequency band higher than the low frequency band, and a signal node for the GSM method using power higher than that of the W-CDMA method, it is sufficient to use the W-CDMA method of the low frequency band as one of signal nodes selected. For example, when the semiconductor integrated circuit device has a common transistor for coupling a plurality of reception nodes to an antenna node, it is sufficient to select, as another signal node to be selected, a node on the side opposite to the side of the antenna node in the common transistor.

An effect obtained by the representative ones of the inventions disclosed in the specification is, briefly, that reduction in the high-order harmonic distortion or IMD can be realized.

BRIEF DESCRIPTION OF THE DRAWINGS

FIGS. 6A to 6C show an example of a switch circuit examined as the pre-condition of the present invention, in which FIG. 6A is a circuit diagram showing an example of the configuration of the switch circuit, FIG. 6B is an equivalent circuit device of an on-device in FIG. 6A, and FIG. 6C is a diagram showing an example of the operation of the circuit.

DETAILED DESCRIPTION OF THE PREFERRED EMBODIMENTS

Figure 1:
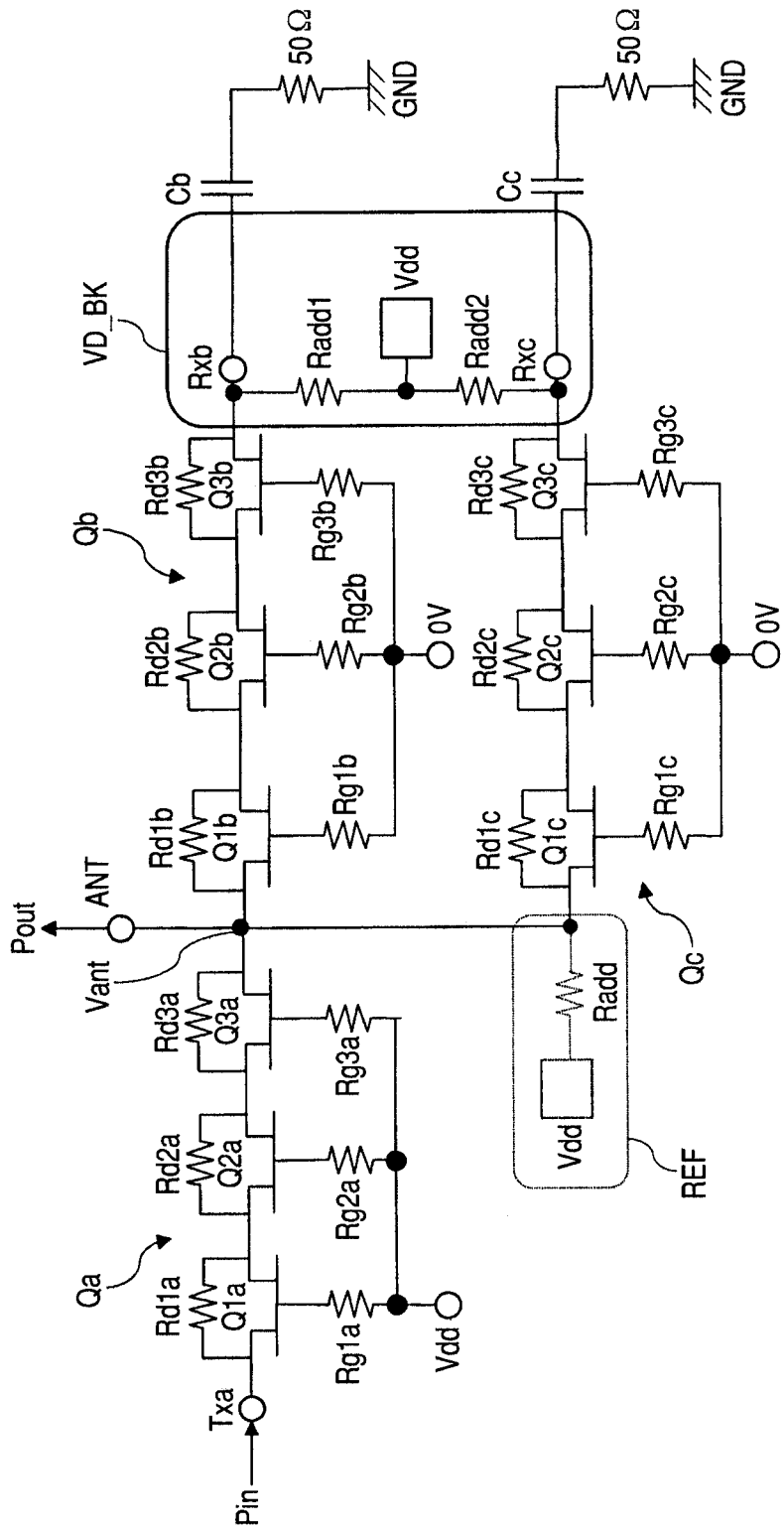
FIG. 1 is a circuit diagram illustrating a basic concept of a semiconductor integrated circuit device as an embodiment of the invention.

As necessary for convenience, the present invention will be described below in sections or embodiments. Unless explicitly described otherwise, the sections and embodiments are not irrelevant to each other. A section may be a modified, detailed, or complementary part of another section. In the following embodiments, the number and the like of elements is not limited to a specific number but may be larger or smaller than the specific number except for the case such that the number is clearly specified or obviously limited to a specific value.

Further, in the following embodiments, the elements (including steps) are not always essential except for the case where an element is clearly specified as an essential one or is obviously essential. Similarly, in the following embodiments, the shape, position, and the like of a component include similar shapes and similar positions except for the case where the shape, position, and the like are clearly specified or obviously limited. This rule also applies to the numerical values and the ranges.

Embodiments of the present invention will be described in detail hereinbelow with reference to the drawings. In all of drawings illustrating the embodiments, as a rule, the same reference numerals are designated for the same members, and repetitive description will not be given.

FIG. 1 is a circuit diagram showing the basic concept of a semiconductor integrated circuit device as an embodiment of the invention. The semiconductor integrated circuit device shown in FIG. 1 includes, for example, transistors Qa whose sources and drains are coupled between an antenna terminal (antenna node) ANT and a signal terminal (signal node) Txa, transistors Qb whose sources and drains are coupled between the antenna terminal ANT and a signal terminal Rxb, and transistors Qc whose sources and drains are coupled between the antenna terminal ANT and a signal terminal Rxc. Although not shown, the signal terminal Txa is a transmission terminal (transmission node), and the signal terminals Rxb and Rxc are reception terminals (reception nodes). The signal terminals Rxb and Rxc are coupled to terminating resistors of 50 Ω or the like via capacitative elements Cb and Cc, respectively.

The transistors Qa are, for example, single-gate transistors Q1a, Q2a, and Q3a coupled in three stages. Resistive elements Rg1a, Rg2a, and Rg3a are coupled to the gates of the transistors Q1a, Q2a, and Q3a, respectively. Resistive elements Rd1a, Rd2a, and Rd3a are coupled between the source and drain of Q1a, Q2a, and Q3a, respectively. Similarly, the transistors Qb and Qc are also single-gate transistors Q1b, Q2b, and Q3b coupled in three stages and single-gate transistors Q1c, Q2c, and Q3c coupled in three stages, respectively. Resistive elements Rg1b, Rg2b, and Rg3b are coupled to the gates of the transistors Q1b, Q2b, and Q3b, respectively. Resistive elements Rd1b, Rd2b, and Rd3b are coupled between the source and drain of Q1b, Q2b, and Q3b, respectively. Resistive elements Rg1c, Rg2c, and Rg3c are coupled to the gates of the transistors Q1c, Q2c, and Q3c, respectively.

Resistive elements Rd1c, Rd2c, and Rd3c are coupled between the source and drain of Q1c, Q2c, and Q3c, respectively.

In such a configuration, the semiconductor integrated circuit device of FIG. 1 is mainly characterized in that a voltage supply circuit VD_BK is coupled to the signal terminals Rxb and Rxc. The voltage supply circuit VD_BK is constructed by a voltage supply terminal (voltage supply node and voltage) Vdd, a resistive element Radd1 coupling Vdd and Rxb, and a resistive element Radd2 coupling Vdd and Rxc. By using the voltage supply circuit VD_BK, as described below, high-order harmonic distortion or IMD can be reduced.

As one of means for deepening −Vant by increasing an antenna voltage Vant, a method of directly supplying bias voltage to the antenna terminal ANT is considered. A usable voltage is only Vdd (approximately 3.0V) same as the control voltage for turning on/off transistors. Therefore, a circuit for supplying the voltage Vdd directly to the antenna terminal ANT via a resistor having a high resistance value may be used. The issues rising in this case are the coupling position and the resistance value of the resistor.

Figure 7A:
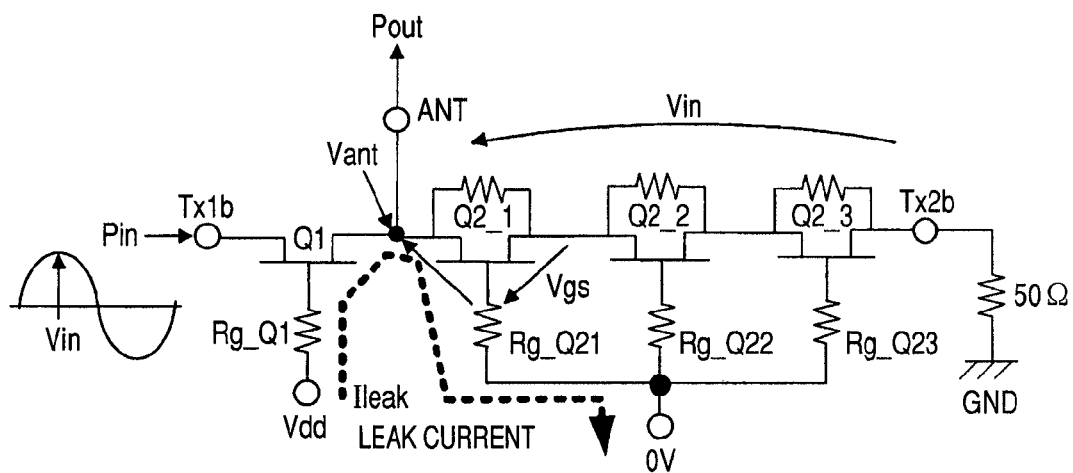
FIGS. 7A and 7B show an example of the configuration and operation of a modification of the switch circuit of FIGS. 6A to 6C, and respectively show a circuit diagram showing an example of the configuration, and a diagram showing an example of the operation.
Figure 7B:
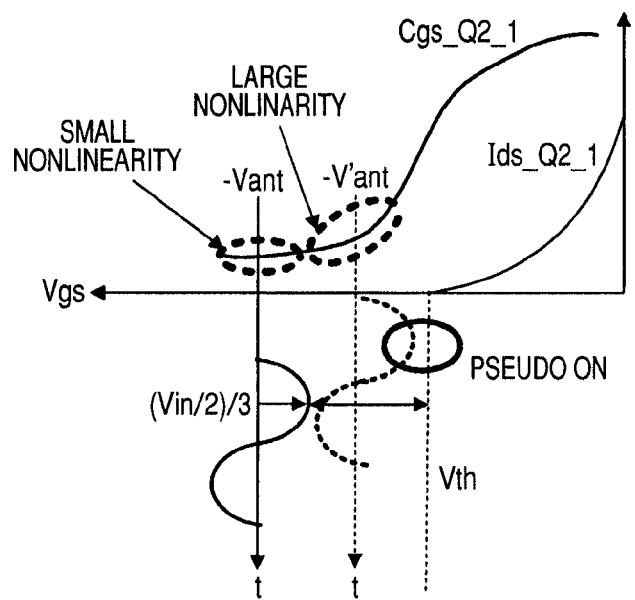

With respect to the resistance value, as described above with reference to FIG. 7 and the like, the higher the voltage Vant becomes (the deeper the voltage −Vant becomes), the more it is desirable for an off-state transistor. On the other hand, in an on-state transistor, as the voltage Vant increases, the difference between the voltage Vdd applied to the gate and the voltage Vant of the drain (source) becomes smaller. To address the reduction in the forward bias of the gate, as a result, on resistance Ron increases and an insertion loss increases. Consequently, a limiting point exists in the difference between Vant and Vdd. By simulations, for example, a voltage lower than Vdd by about 0.3V is obtained as the optimum point of Vant. The resistance value for realizing Vant=2.7V when Vdd equals to 3.0V is about 50 kΩ when a leak current Ileak is assumed as 10 µA.

On the other hand, the resistance value is desired to be as large as possible so as not to exert an influence on a high frequency signal due to the resistance value itself. Specifically, for example, as described in the reference document 3, in the case of coupling a resistive element between the antenna terminal ANT and a voltage supply terminal (a ground terminal in the reference document 3), the resistance value has to be set to 100 kΩ or larger so as not to exert an influence on higher-order harmonic distortions (2HD and 3HD). Therefore, in the coupling position of a circuit REF shown in FIG. 1 or the like, without exerting an influence is exerted on the high-order harmonic distortion, it is difficult to determine the value of a proper resistive element Radd for making Vant close to 2.7V.

Means for solving the problem is, like the voltage supply voltage VD_BK in FIG. 1, to provide resistive elements for the signal terminal Rxb coupled to the antenna terminal ANT via the transistors Qb and the signal terminal Rxc coupled to the antenna terminal ANT via the other transistors Qc and supply voltage to the terminals via the resistive elements. With the configuration, at the time of transmission (Qa: on, and Qb and Qc: off), the state is equivalent to a state where the two resistive elements Radd1 and Radd2 are coupled in parallel via the resistive elements Rd coupled between the drains and sources of the transistors Qb (Q1b, Q2b, and Q3b) and the transistors Qc (Q1c, Q2c, and Q3c) which are off. Therefore, the resistance value of each of the resistive elements Radd1 and Radd2 can be set to, for example, 100 kΩ corresponding to twice as large as 50 kΩ.

In the above configuration, the resistive elements are coupled in parallel from the voltage supply terminal Vdd to the two signal terminals. Similarly, the resistive elements can be also coupled in parallel from the voltage supply terminal Vdd to three or more signal terminals. In this case, the resistance value of each of the resistive elements can be further increased. However, when the resistance value is increased or the number of resistive elements is increased, the circuit area increases accordingly, and it is feared that unnecessary reactance components such as parasitic capacitance and parasitic inductance increase. From the viewpoint, it is desirable to provide two signal terminals to which the resistive elements are coupled. Since the actual resistive elements have a reactance component, it is effective to couple the resistive element to a signal terminal using a low frequency band or a signal terminal having passing power.

By using the semiconductor integrated circuit device as shown in FIG. 1 and supplying the bias voltage Vdd to two or more signal terminals via high resistance (for example, 100 kΩ), the antenna voltage Vant which drops due to leak current can be increased. As a result, the transistors Qb (Q1b, Q2b, and Q3b) and Qc (Q1c, Q2c, and Q3c) in the off state enter a deeper off state, and operate in a region where nonlinearity of Cgs is small without entering a false on state. Thus, high-order harmonic distortion or IMD can be reduced. Since the resistive elements coupled to the signal terminals have a large resistance value (for example, 100 kΩ), a characteristic degradation in high-order harmonic distortion or IMD caused by the resistive elements themselves does not become an issue.

Figure 2:
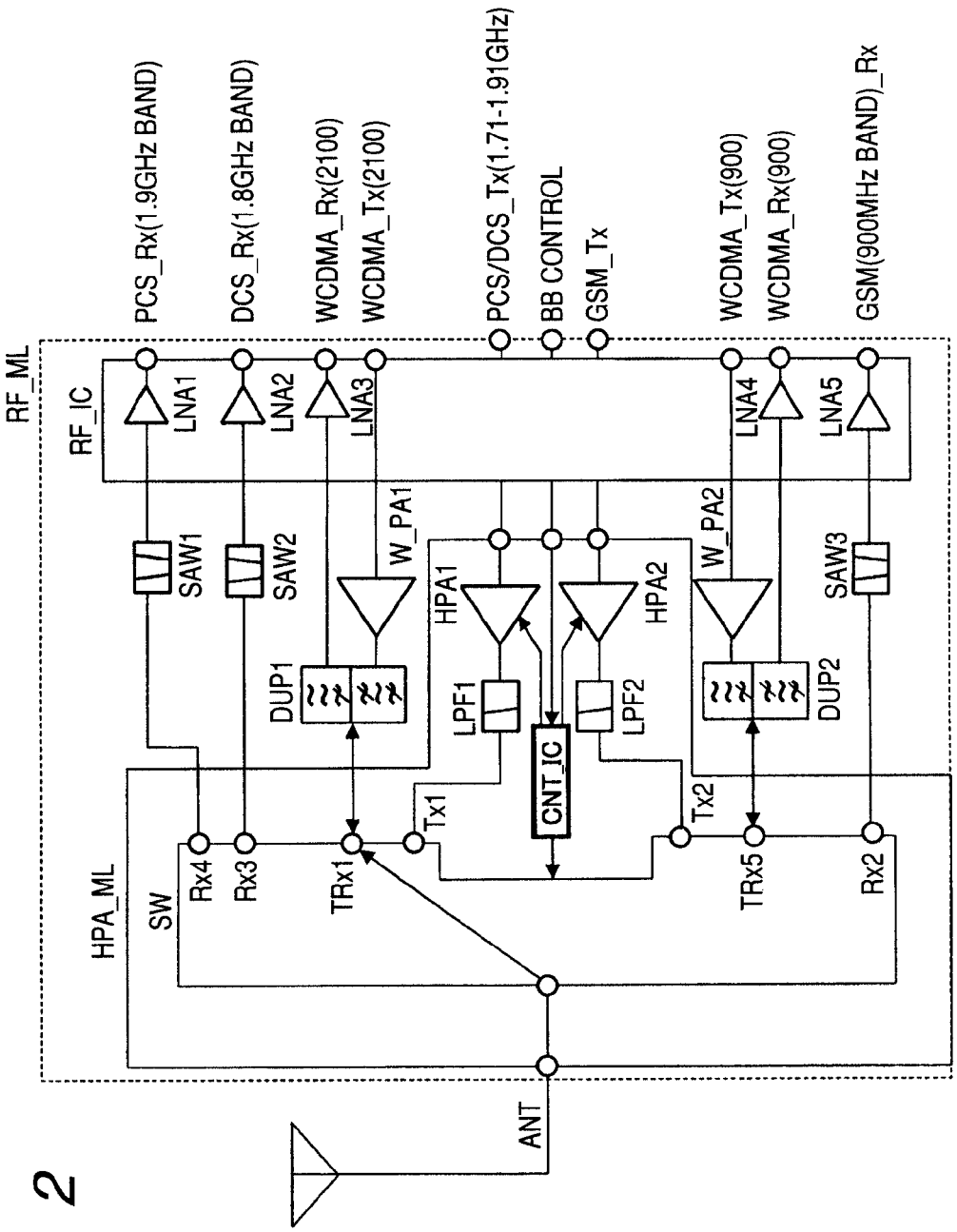
FIG. 2 is a block diagram illustrating an example of the general configuration of the semiconductor integrated circuit device as the embodiment of the invention.

FIG. 2 is a block diagram showing an example of the general configuration of the semiconductor integrated circuit device as an embodiment of the invention. An example of the semiconductor integrated circuit device shown in FIG. 2 is a radio frequency module RF_ML used in a cellular phone as one of the radio communication systems. The radio frequency module RF_ML includes a power amplifying unit HPA_ML, a signal processing unit RF_IC, SAW (Surface Acoustic Wave) filters SAW1 to SAW3, power amplifiers W_PA1 and W_PA2 for W-CDMA, and duplexers DUP1 and DUP2. RF_IC includes low noise amplifiers LNA1 to LNA5. HPA_ML includes power amplifiers HPA1 and HPA2, low pass filters LPF1 and LPF2, a control unit CNT_IC, and a switch circuit SW.

The switch circuit SW has a so-called SP7T configuration of coupling any of the seven signal terminals (transmission terminals Tx1 and Tx2, reception terminals Rx2 to Rx4, and transmission/reception terminals TRx1 and TRx5) to the antenna terminal ANT to which the antenna is coupled. The signal terminal to be coupled is selected by the control unit CNT_IC on the basis of a control signal from a baseband circuit (not shown). A transmission signal in the PCS system or DCS system using the 1.71 GHz to 1.91 GHz band is amplified by HPA1, and the amplified signal is input to the transmission terminal Tx1 via LPF1. A transmission signal in the GSM system using the 900 MHz band is amplified by HPA2, and the amplified signal is input to the transmission terminal Tx2 via LPF2. A selected one of the transmission signals is selected by the control unit CNT_IC and output via the antenna terminal ANT. The control unit CNT_IC also controls the amplification factor of HPA1 or HPA2 and the like on the basis of a control signal from the baseband circuit.

On the basis of the selection of the control unit CNT_IC, a signal having a specific frequency (PCS: 1.9 GHz band) is selected by SAW1 among reception signals input to the reception terminal Rx4 from the antenna terminal ANT, and amplified by LNA1. The amplified signal is output to a demodulation circuit (not shown) and the like. Similarly, among reception signals input to the reception terminal Rx3, a reception signal having a specific frequency (DCS: 1.8 GHZ band)

is selected by SAW2 and amplified by LNA2. Among reception signals input to the reception terminal Rx2, a reception signal having a specific frequency (GSM: 900 MHz band) is selected by SAWS and amplified by LNA5. The amplified signals are output to the not-shown demodulation circuit and the like.

A transmission signal in the W-CDMA system using the 2.1 GHz band is amplified by W_PA1. The amplified signal undergoes discrimination of transmission/reception signals in DUP1 and is input to the transmission/reception terminal TRx1. According to selection of CNT_IC, the signal is output via ANT. On the other hand, the reception signal input from ANT to TRx1 undergoes discrimination in DUP1 and is amplified by LNA3, and the amplified signal is output to a not-shown demodulation circuit and the like. Similarly, a transmission signal in the W-CDMA system using the 900 MHz band is amplified by W_PA2. The amplified signal undergoes discrimination of transmission/reception signals in DUP2 and is input to the transmission/reception terminal TRx5. According to selection of CNT_IC, the signal is output via ANT. On the other hand, the reception signal input from ANT to TRx5 undergoes discrimination in DUP1 and is amplified by LNA4, and the amplified signal is output to a not-shown demodulation circuit and the like.

Figure 3:
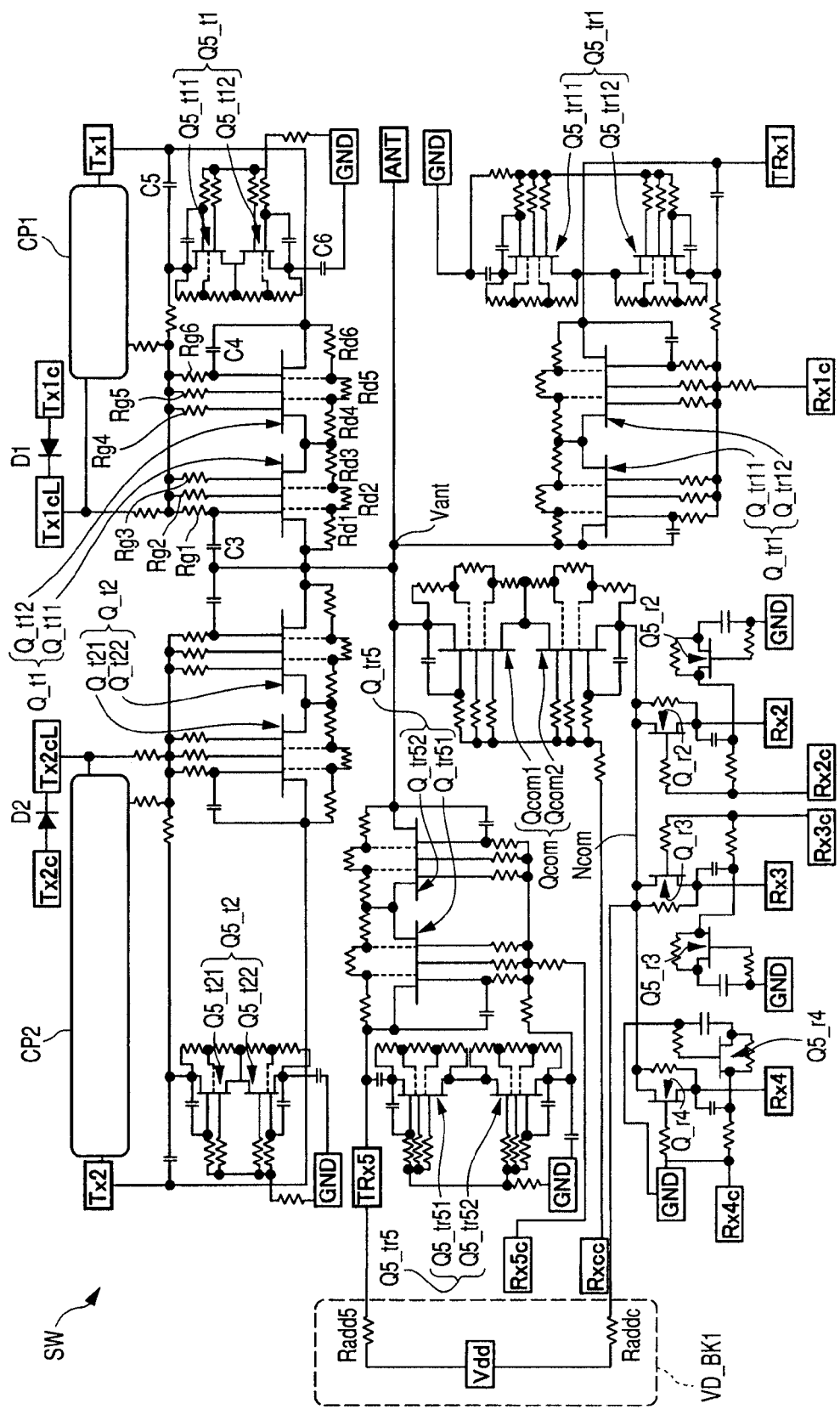
FIG. 3 is a circuit diagram showing a detailed configuration example of a switch circuit in the semiconductor integrated circuit device in FIG. 2.

FIG. 3 is a circuit diagram showing a detailed configuration example of the switch circuit in the semiconductor integrated circuit device of FIG. 2. The switch circuit SW shown in FIG. 3 has Tx1 for PCS/DCS transmission, Tx2 for GSM transmission, antenna terminal (antenna node) ANT, TRx5 for W-CDMA (900 MHz band) transmission/reception, TRx1 for W-CDMA (2.1 GHz band) transmission/reception, Rx4 for PCS reception, Rx3 for DCS reception, and Rx2 for GSM reception.

A transistor circuit Q_t1 made of triple-gate transistors Q_t11 and Q_t12 in two stages is coupled between Tx1 and ANT. A transistor circuit Q5_t1 made of double-gate transistors Q5_t11 and Q5_t12 coupled in two stages is coupled between Tx1 and the ground terminal GND. Similarly, a transistor circuit Q_t2 made of triple-gate transistors Q_t21 and Q_t22 in two stages is coupled between Tx2 and ANT. A transistor circuit Q5_t2 made of double-gate transistors Q5_t21 and Q5_t22 in two stages is coupled between Tx2 and GND.

A transistor circuit Q_tr5 made of triple-gate transistors Q_tr51 and Q_tr52 in two stages is coupled between TRx5 and ANT. A transistor circuit Q5_tr5 made of triple-gate transistors Q5_tr51 and Q5_tr52 in two stages is coupled between TRx5 and GND. Similarly, a transistor circuit Q_tr1 made of triple-gate transistors Q_tr11 and Q_tr12 in two stages is coupled between TRx1 and ANT. A transistor circuit Q5_tr1 made of triple-gate transistors Q5_tr11 and Q5_tr12 in two stages is coupled between TRx1 and GND.

A transistor circuit Qcom made of triple-gate transistors Qcom1 and Qcom2 in two stages is coupled between ANT and a reception common node Ncom. A single-gate transistor Q_r2 is coupled between the reception common node Ncom and Rx2, and a single-gate transistor Q5_r2 is coupled between Rx2 and GND. Similarly, a single-gate transistor Q_r3 is coupled between Ncom and Rx3, and a single-gate transistor Q5_r3 is coupled between Rx3 and GND. A single-gate transistor Q_r4 is coupled between Ncom and Rx4, and a single-gate transistor Q5_r4 is coupled between Rx4 and GND.

As described above, a transistor (or transistor circuit) Q to be coupled to ANT and a transistor (or transistor circuit) Q5 to be coupled to GND are provided for each of the signal terminals. Since high power is applied to the transistors Q_t1, Q_t2, Q_tr1, Q_tr5, and Qcom, the transistors have the triple-gate two-stage configuration (corresponding to single transistors in six stages) for reducing distortion. The transistors Q5_tr1 and Q5_tr5 coupled between the signal terminals TRx1 and TRx5 for W-CDMA and GND, respectively have the triple-gate two-stage configuration for reducing IMD.

In the configurations of the transistors (or transistor circuits) Q and Q5, the number of gates or the number of stages are basically similar although they may vary according to the influence of such distortion, passing power, and the like. Consequently, the configuration of the transistors Q_tr1 and Q5_t1, as a representative, coupled to the transmission terminal Tx1 will be described in detail. The others will be briefly described. First, in Q_t1, one end of the source and drain of Q_t11 is coupled to ANT, one end of the source and drain of Q_t12 is coupled to Tx1, and the other end of Q_t11 and the other end of Q_t12 are commonly coupled.

The three gates of Q_t11 are coupled to a control terminal Tx1cL via resistive elements Rg1, Rg2, and Rg3. A capacitive element C3 is coupled between one end (on the ANT side) of the source and drain of Q_t11 and a gate closest to the one end. Similarly, the three gates of Q_t12 are coupled to Tx1cL via resistive elements Rg4, Rg5, and Rg6. A capacitive element C4 is coupled between one end (on the Tx1 side) of the source and drain of Q_t12 and a gate closest to the one end. Resistive elements Rd1, Rd2, and Rd3 are coupled in series between one end and the other end of the source and drain of Q_t11. A bias is supplied to an intermediate point of two gates in Q_t11 from a connection node between Rd1 and Rd2 and a connection node between Rd2 and Rd3. Similarly, resistive elements Rd4, Rd5, and Rd6 are coupled in series between one end and the other end of the source and drain of Q_t12. A bias is supplied to an intermediate point of two gates in Q_t12 from a connection node between Rd4 and Rd5 and a connection node between Rd5 and Rd6.

As described above, by the multi-gate configuration, addition of the capacitive elements, and supply of bias to the intermediate point between two gates, the low distortion characteristic as described in the patent document 1 and the reference documents 1 to 4 can be realized. As described with reference to FIG. 7, by employing the configuration of coupling transistors in multiple stages, high frequency voltage applied per stage can be lowered. Thus, high-order harmonic distortion can be reduced.

To the control terminal Tx1cL, a control voltage input from the control unit CNT_IC to the control terminal Tx1c in FIG. 1 is applied via a diode D1 (the Tx1c side is the anode and the Tx1cL side is the cathode). The diode D1 has the function of preventing backflow from the gate of Q_t1 as described in the reference document 4. Since high power is input to the transmission terminal Tx1, a booster circuit CP1 is coupled between the gate of Q_t1 and Tx1. By CP1, the gate voltage for turning on Q_t1 can be boosted.

On the other hand, in Q5_t1, one end of the source and drain of Q5_t11 is coupled to Tx1 (accurately, an AC signal is coupled via a capacitor C5), one end of the source and drain of Q5_t12 is coupled to GND (accurately, an AC signal is coupled via a capacitor C6), and the other end of Q5_t11 and the other end of Q5_t12 are commonly coupled. Each of the transistors Q5_t11 and Q5_t12 has a double-gate configuration. Each of the gates is coupled to GND via a resistive element. Like Q_t1, a capacitive element is coupled between one end (on the Tx1 side) of the source and drain of Q5_t11 and the gate close to the one end. A capacitive element is also coupled between one end (on the GND side) of the source and drain of Q5_t12 and the gate close to the one end. Further, like Q_t1, two resistive elements are coupled in series between the source and drain of each of Q5_t11 and Q5_t12. From the connection node of the resistive elements, a bias is supplied to an intermediate point of the gates.

The transistor circuit Q5_t1 is turned off when the 'H' level voltage is applied to Tx1cL and the transistor circuit Q_t1 is turned on. The transistor circuit Q5_t1 is turned on when the 'L' level voltage is applied to Tx1cL and the transistor circuit Q_t1 is turned off. Therefore, when Q_t1 is turned off, Tx1 is coupled to GND, the influence of impedance (for example, LPF1 and the like) after Tx1 can be concealed, and distortion and the like accompanying fluctuations in the impedance can be prevented.

The transistor circuits Q_t2 and Q5_t2 coupled to the transmission terminal Tx2 have a configuration similar to that of the transistors Q_t1 and Q5_t1. The on/off state of Q_t2 and the on/off state of Q5_t2 are controlled by a control terminal Tx2cL coupled to the gate of Q_t2 and one end of the source and drain of Q5_t2. To Tx2cL, a control voltage input from the control unit CNT_IC to the control terminal Tx2c in FIG. 1 is applied via a diode D2 for preventing backflow. Since high power is input to Tx2 in a manner similar to Tx1, a booster circuit CP2 is coupled between Tx2 and the gate of Q_t2 in a manner similar to Q_t1.

The transistor circuits Q_tr5 and Q5_tr5 coupled to the transmission/reception terminal TRx5 have configurations similar to those of the transistors Q_tr1 and Q5_t1 except that Q5_tr5 has a configuration of triple-gate transistors in two stages. The on/off state of Q_tr5 and the on/off state of Q5_tr5 are controlled by a control terminal Rx5c coupled to the gate of Q_tr5 and one end of the source and drain of Q5_tr5. A diode for preventing backflow is not necessary for Rx5c, and a control voltage is directly applied from the control unit CNT_IC in FIG. 1 to Rx5c. A booster circuit as described above is not provided for the gate of Q_tr5 for the reason that, since an RF power input to TRx5 at the time of transmission is small, the booster circuit does not function fully, and the booster circuit may deteriorate the IMD characteristic.

The transistor circuits Q_tr1 and Q5_tr1 coupled to the transmission/reception terminal TRx1 also have a configuration similar to that of the transistors Q_tr5 and Q5_tr5. The on/off state of Q_tr1 and the on/off state of Q5_tr1 are controlled by a control terminal Rx1c coupled to the gate of Q_tr1 and one end of the source and drain of Q5_tr1. A diode for preventing backflow is also not necessary for Rx1c, and a control voltage is directly applied from the control unit CNT_IC in FIG. 1 to Rx1c. A booster circuit as described above is not provided for the gate of Q_tr1.

The transistor circuit Qcom coupled to the antenna ANT has a configuration of triple-gate transistors in two stages like the transistor circuit Q_t1. The gate voltage of the transistor circuit Qcom is controlled by a control terminal Rxcc coupled to the control unit CNT_IC in FIG. 1. The transistor circuit Qcom is turned on when a signal received from the antenna terminal ANT is coupled to any of the reception terminals Rx2, Rx3, and Rx4. By combining the reception terminals Rx2 to Rx4 by Qcom, a load on the antenna terminal ANT is reduced, and the high-order harmonic distortion characteristic and the like can be improved.

The transistors Q_r2 and Q5_r2 coupled to the reception terminal Rx2 are single-gate transistors. One end of the source and drain of Q_r2 is coupled to the reception common node Ncom, the other end is coupled to Rx2, and the gate of Q_r2 is coupled to the control terminal Rx2c via a resistive element. A control voltage is applied from the control unit CNT_IC in FIG. 1 to Rx2c. Although a resistive element is coupled between the source and drain of Q_r2, because of the single gate configuration, no bias to the intermediate point of the gates exists. Since the single gate configuration is used, it is unnecessary to couple a capacitive element between the gate and the source and drain. On the other hand, an AC signal is coupled from one end of the source and drain of Q5_r2 to Rx2, an AC signal is coupled from the other end to GND, and the gate of G5_r2 is coupled to GND via the resistive element. A resistive element is provided between the source and drain of Q5_r2. For the reception terminal Rx2, a diode for preventing backflow and a boosting circuit are unnecessary.

The transistors Q_r3 and Q5_r3 coupled to the reception terminal RX3 are also single-gate transistors and have a configuration similar to the above-described configuration of Q_r2 and Q5_r2. The on/off state of Q_r3 and the on/off state of Q5_r3 are controlled by a control terminal Rx3c coupled to the gate of Q_r3 and one end of the source and drain of Q5_r3. The transistors Q_r4 and Q5_r4 coupled to the reception terminal Rx4 are also single-gate transistors and have a configuration similar to the above-described configuration of Q_r2 and Q5_r2. The on/off state of Q_r4 and the on/off state of Q5_r4 are controlled by a control terminal Rx4c coupled to the gate of Q_r4 and one end of the source and drain of Q5_r4. To the control terminals Rx3c and Rx4c, a control voltage is directly applied from the control unit CNT_1 in FIG. 1.

In such a configuration, the switch circuit SW of FIG. 3 is provided with a voltage supply circuit VD_BK1 similar to the voltage supply circuit in FIG. 1 between TRx5 for W-CDMA (900 MHz band) transmission/reception and the reception common node Ncom as one end of the transistor circuit Qcom. VD_BK1 is constructed by the voltage supply terminal (voltage supply node, voltage) Vdd, a resistive element Radd5 coupled between Vdd and TRx5, and a resistive element Rddc coupled between Vdd and Ncom. The resistance value of each of the resistive elements Radd5 and Rddc is, for example, 100 kΩ. Although there are a plurality of options for the position of a terminal (or node) provided with VD_BK1, as will be described below, it is desirable to provide VD_BK1 in the position shown in FIG. 3.

For example, in the case of forming a resistive element on a semiconductor substrate, a parasitic component such as parasitic capacitance or parasitic inductance exists in the actual resistive element. It is therefore effective to couple the resistive element to a signal terminal of a low frequency band on which the influence of the parasitic component is small or a signal terminal in which passing power is small. Accordingly, among the signal terminals and the nodes in the switch SW in FIG. 3, TRx5 as the signal terminal for the W-CDMA system of low transmission power and a low frequency band (900 MHz band) and the reception common node Ncom on which the influence of high power in the GSM band is reduced by Qcom and in which only a small power signal passes are optimum.

In the case of forming the resistive elements Radd5 and Rddc on the semiconductor substrate, to generate 100 kΩ as standard sheet resistance (for example, 500 Ω/□), the length of about 0.8 mm is necessary. On the other hand, the cellular phone system as shown in FIG. 2 is strongly requested to achieve a large chip area and low chip cost, so that it is desirable to reduce the number of resistive elements as much as possible. Therefore, although the resistive elements may be disposed in three or more positions as described with reference to FIG. 1, from the above-described viewpoints, it is most desirable to dispose the resistive elements in two positions shown in FIG. 3.

Further, the resistance value of each of the resistive elements Radd5 and Rddc is set to 100 kΩ or higher from the viewpoint that no influence is exerted on harmonic distortion and an insertion loss of an on-transistor is permissible. The resistance value of 100 kΩ which is the smallest in the range is used from the viewpoint of realizing deepening of −Vant in the range with a small area. However, the optimum range of the resistance value varies according to various circuit parameters, process parameters, further, chip area parameters, and the like. In the case of considering various parameters of general SP7T, substantially, the suitable range of the resistance value is, for example, 100 kΩ to 200 kΩ, desirably, 100 kΩ to 150 kΩ.

By using the switch circuit (semiconductor integrated circuit device) of FIG. 3, as described above with reference to FIG. 1, the antenna voltage Vant dropped due to leak current can be increased, and a transistor in an off state operates in a region where nonlinearity of Cgs is small without entering a false on state. Thus, high-order harmonic distortion or IMD can be reduced. Since the resistive elements coupled to the signal terminals have a large resistance value (for example, 100 kΩ) and a signal of relatively low power and/or low frequency is applied to the signal terminals, a characteristic degradation in high-order harmonic distortion or IMD caused by coupling of the resistive elements does not become an issue.

Since the transistors Q_t1, Q_t2, Q_tr5, Qcom, and Q_tr1 in FIG. 3 have the triple-gate two-stage configuration, as described above with reference to FIG. 7 and the like, the high frequency voltage of Vgs can be lowered so that high-order harmonic distortion and IMD can be reduced. Further, by setting the number of resistive elements to be added to two, area overhead can be reduced, and increase in the area of the radio frequency module RF_ML in FIG. 2 can be suppressed. In addition, reduction in distortion of the switch circuit can be realized. Consequently, design margin of the other parts (the low-pass filter LPF, the power amplifier HPA, and the like) in RF_ML in FIG. 2 is increased, and the cost of RF_ML can be lowered.

Figure 4A:
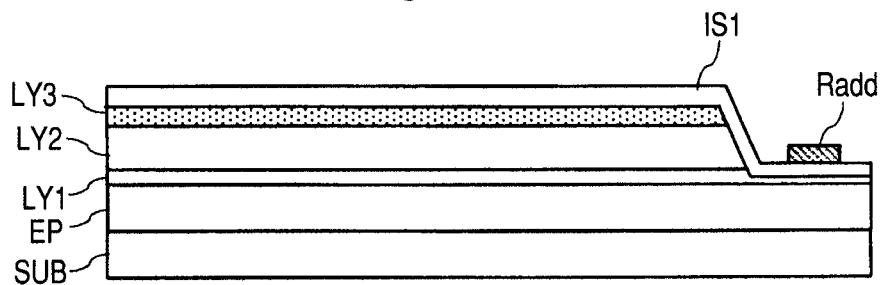
FIGS. 4A to 4C are cross sections each schematically showing a device structure at each of manufacturing stages as an example of a method of manufacturing a resistive element and a triple gate transistor in a voltage supply circuit shown in FIG. 3.
Figure 4B:
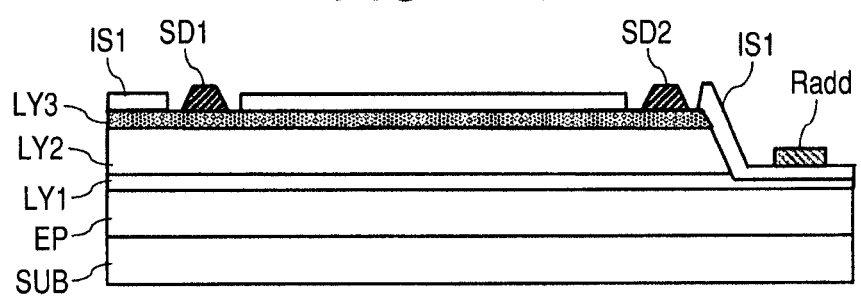
Figure 4C:
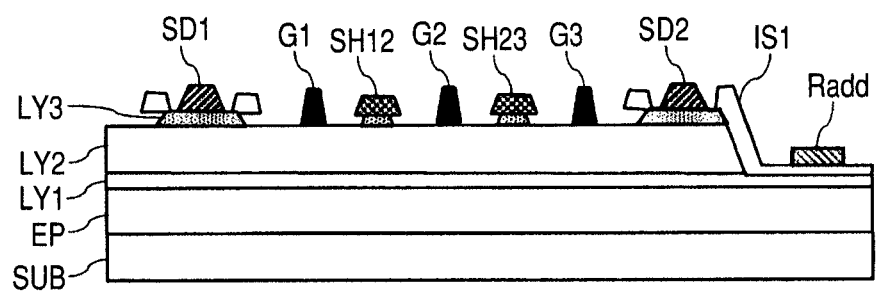
Figure 5:
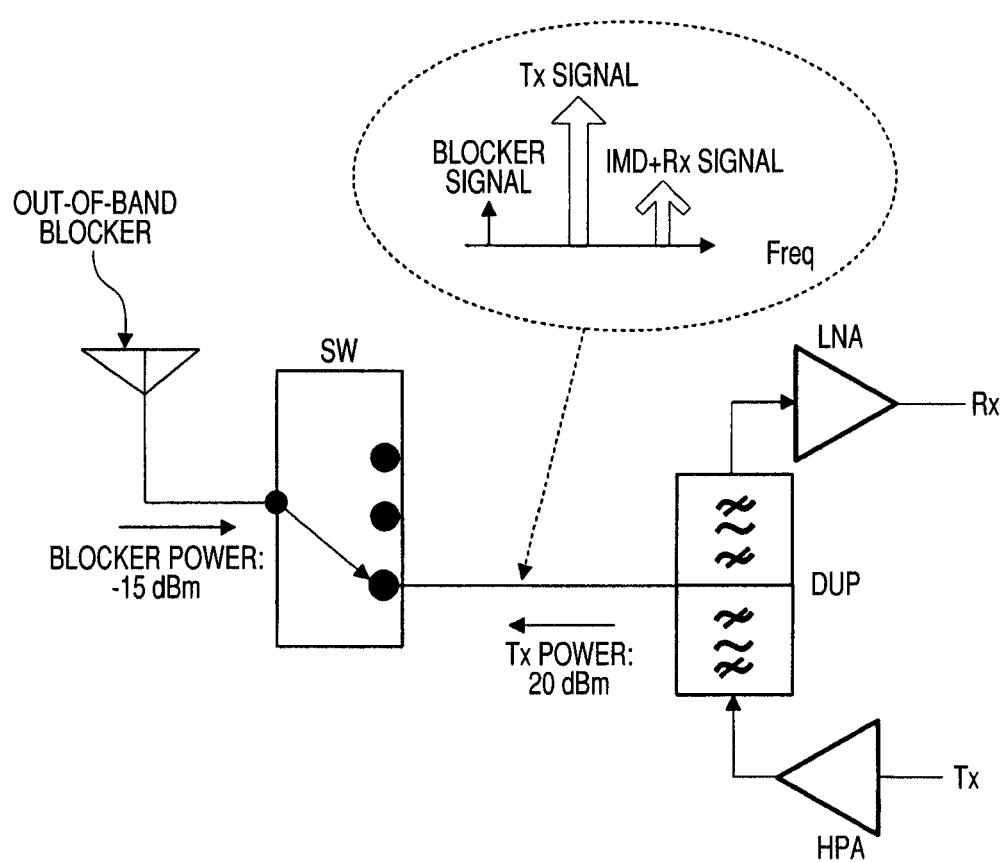
FIG. 5 is a simplified block diagram illustrating a configuration example of a W-CDMA unit.
Figure 6A:
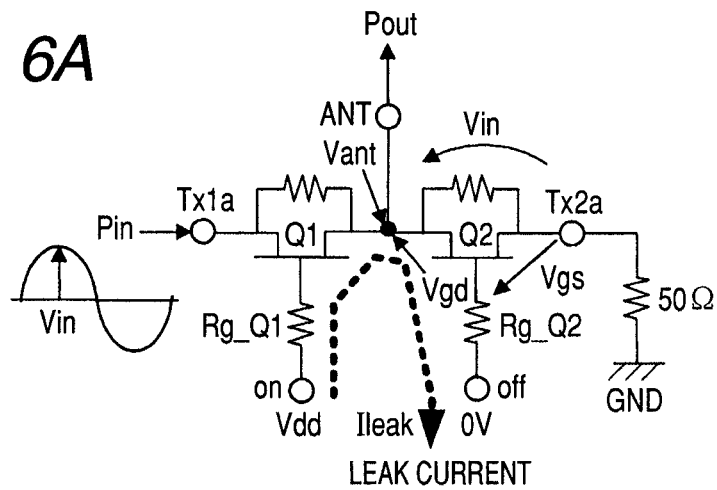
Figure 6B:
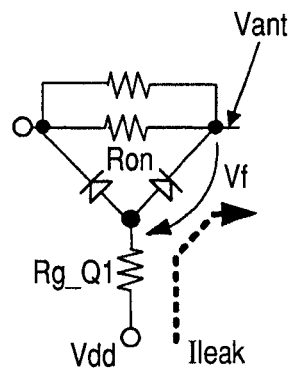
Figure 6C:
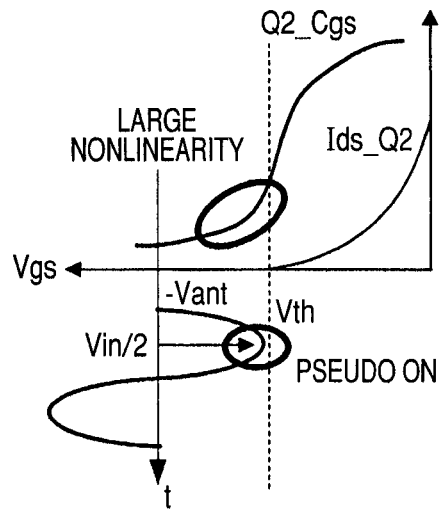

FIGS. 4A, 4B, and 4C are cross sections schematically showing a device structure in manufacturing steps as an example of a method of manufacturing a resistive element and a triple-gate transistor in the voltage supply circuit of FIG. 3. First, as shown in FIG. 4A, an epitaxial layer EP made of GaAs is formed over a substrate SUB made of semi-insulating gallium arsenide (GaAs), and a buffer layer LY1 is formed over the top face of the epitaxial layer EP. Over the top face of the buffer layer LY1, an aluminum gallium arsenide (Al-GaAs) layer LY2 is formed. Over the top face of the layer LY2, an n-type gallium arsenide (GaAs) layer LY3 is formed.

Subsequently, the AlGaAs layer LY2 and the n-type GaAs layer LY3 in a right part in FIG. 4A is etched and an insulating film IS1 made of, for example, PSG (Phospho Silicate Glass)/SiO is formed. Over the insulating film IS1, the resistive element Radd made of, for example, WSiN is formed in the position where the layers LY2 and LY3 were etched. After that, as shown in FIG. 4B, the insulating film IS1 in positions where source/drain lines SD1 and SD2 are to be disposed is etched, and the source/drain lines SD1 and SD2 are formed by metal wires or the like.

As shown in FIG. 4C, the insulating film LS1 and the n-type GaAS layer LY3 in the positions where three gate lines G1, G2, and G3 are to be disposed in the area sandwiched by the source/drain lines SD1 and SD2 are etched, and the three gate lines G1, G2, and G3 are formed by metal lines or the like. The insulating film IS1 between the gate lines G1 and G2 and between the gate lines G2 and G3 is etched, and power supply lines SH12 and SH23 made by an n⁺ layer or the like are formed. By the power supply lines SH12 and SH23, a bias at an intermediate point between gates as described with reference to FIG. 3 is supplied. In such a manner, an HEMT (High Electron Mobility Transistor) and a resistive element having a triple-gate configuration as shown in FIG. 4 are formed.

By forming the transistors and the resistive element Radd on the same substrate as described above, high integration is realized, and the switch circuit and the radio frequency module RF_ML having a small area can be realized.

Although the invention achieved by the inventors herein has been concretely described above, obviously, the invention is not limited to the foregoing embodiments but can be variously modified without departing from the gist.

For example, the invention has been described by using the example of the switch circuit used for a multi-band cellular phone system. However, the invention is not limited to the switch circuit but can be similarly applied to various radio communication systems including a wireless LAN antenna switch adapted to a plurality of bands (for example, the 2.4 GHz band and 5 GHz band).

The semiconductor integrated circuit device and the radio frequency module according to the present invention are techniques particularly useful when applied to a switch circuit of SP7T or newer version and a radio frequency module for a cellular phone including the switch circuit. The invention is not limited to them but can be widely applied to a switch circuit for a cellular phone of SP6T or older version, an antenna switch for a wireless LAN, and the like.

The invention claimed is:

1. A semiconductor integrated circuit device comprising:
   an antenna node coupled to an antenna;
   a voltage supply circuit including a first resistive element, a second resistive element and a voltage supply node coupled to the first and second resistive elements;
   a plurality of signal nodes including a first signal node for a transmission signal and a reception signal, a second signal node for the reception signal and a third signal node for the transmission signal; and
   a plurality of transistor circuits including a first transistor circuit, a second transistor circuit and a third transistor circuit, each having a triple-gate, two-stage configuration,
   wherein the first transistor circuit is coupled between the first signal node and the antenna node, includes a first source-drain resistive element coupling between sources and drains, and is configured to switch between coupling/decoupling the first signal node and the antenna node,
   wherein the second transistor circuit is coupled between the second signal node and the antenna node, includes a second source-drain resistive element coupling between sources and drains, and is configured to switch between coupling/decoupling the second signal node and the antenna node,
   wherein the third transistor circuit is coupled between the third signal node and the antenna node, includes a third source-drain resistive element coupling between sources and drains, and is configured to switch between coupling/decoupling the third signal node and the antenna node,
   wherein the voltage supply circuit is coupled between the first signal node and the second signal node,
   wherein the first signal node is coupled to the first resistive element of the voltage supply circuit,
   wherein the second signal node is coupled to the second resistive element of the voltage supply circuit, wherein the voltage supply circuit is configured to supply voltage to the first and second signal nodes through the first and second resistive elements, respectively, and wherein the third transistor circuit is turned ON and the first and second transistor circuits are turned OFF, when the transmission signal is transmitted from the third signal node.

2. The semiconductor integrated circuit device according to claim 1, wherein the first signal node is a transmission/reception node for W-CDMA, and wherein the second signal node is a reception node for GSM.

3. The semiconductor integrated circuit device according to claim 2, wherein two of the plurality of signal nodes are signal nodes to which a signal of relatively low power and/or low frequency is applied among the plurality of signal nodes.

4. The semiconductor integrated circuit device according to claim 3, wherein the resistance value of each of the first and second resistive elements is 100 kΩ to 200 kΩ.

5. A high frequency module comprising:

an antenna node coupled to an antenna;

a voltage supply node to which a bias voltage is applied;

a plurality of transmission/reception nodes for transmission/reception signals of a plurality of communication methods;

a plurality of transmission nodes for transmission signals of the plurality of communication methods;

a plurality of reception nodes for reception signals of the plurality of communication methods;

a common node;

a plurality of transmission /reception transistors each coupled between the transmission/reception nodes and the antenna node, having a triple-gate, two-stage configuration, including a first source-drain resistive element coupling between sources and drains, and switching coupling/decoupling between the transmission/reception nodes and the antenna node;

a plurality of transmission transistors each coupled between the transmission nodes and the antenna node, having a triple-gate two-stage configuration, including a second source-drain resistive element coupling between sources and drains, and switching between coupling/decoupling the transmission nodes and the antenna node;

a common transistor coupled between the antenna node and the common node, having a triple-gate two-stage configuration, including a third source-drain resistive element coupling between sources and drains, and switching coupling/decoupling between the antenna node and the common node;

a plurality of reception transistors each coupled between the reception nodes and the common node, having a fourth source-drain resistive element, and switching coupling/decoupling between the reception nodes and the common node;

a first resistive element coupled between a first node as one of the transmission/reception nodes and the voltage supply node;

a second resistive element coupled between the common node and the voltage supply node; and a voltage supply circuit including the voltage supply node, the first resistive element and the second resistive element, wherein one of the transmission transistors is turned ON and the transmission/reception transistors and the common transistor are turned OFF, when the transmission signal is transmitted from one of the transmission nodes.

6. The high frequency module according to claim 5, wherein the communication methods include a W-CDMA method using a low frequency band and a W-CDMA method using a frequency band higher than the low frequency band, and wherein the first node is conformed with the W-CDMA method using the low frequency band.

7. The high frequency module according to claim 6, wherein the resistance value of each of the first and second resistive elements is 100 kΩ to 150 kΩ.

8. The high frequency module according to claim 5, wherein the first node is conformed with a W-CDMA method of the plurality of communication methods.

* * * * *